United States Patent
Seo et al.

(10) Patent No.: US 8,350,772 B2
(45) Date of Patent: Jan. 8, 2013

(54) ANTENNA APPARATUS FOR PRINTED CIRCUIT BOARD HAVING AUXILIARY ANTENNA

(75) Inventors: Jae-Min Seo, Gyeonggi-do (KR);
Jae-Sun Park, Gyeonggi-do (KR);
Kee-Dug Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 567 days.

(21) Appl. No.: 12/584,099

(22) Filed: Aug. 31, 2009

(65) Prior Publication Data

US 2010/0053012 A1    Mar. 4, 2010

(30) Foreign Application Priority Data

Sep. 1, 2008 (KR) ........................ 10-2008-0085917

(51) Int. Cl.
*H01Q 13/10* (2006.01)
*H01Q 1/24* (2006.01)

(52) U.S. Cl. ........................................ 343/770; 343/702
(58) Field of Classification Search .................. 343/767, 343/770, 771, 700 MS, 850, 702
See application file for complete search history.

(56) References Cited

U.S. PATENT DOCUMENTS

| 5,231,406 | A | * | 7/1993 | Sreenivas ............... 343/700 MS |
| 5,594,455 | A | * | 1/1997 | Hori et al. ............... 343/700 MS |
| 7,683,841 | B2 | * | 3/2010 | Mitsui ............................ 343/702 |

* cited by examiner

*Primary Examiner* — Hoang V Nguyen
(74) *Attorney, Agent, or Firm* — Cha & Reiter, LLC

(57) ABSTRACT

An antenna apparatus for a printed circuit board including an auxiliary antenna which includes a printed circuit board and mounting components. An antenna pattern is formed on the printed circuit board, and the antenna apparatus includes a first auxiliary antenna unit formed on an upper surface of the printed circuit board; and a second auxiliary antenna unit provided at a location on a lower surface of the printed circuit board that corresponds to location of the first auxiliary antenna unit on the upper surface of the printed circuit board. Efficiency by the antenna apparatus according to the present invention can be increased by approximately 17%.

19 Claims, 5 Drawing Sheets

ANTENNA APPARATUS FOR PRINTED CIRCUIT BOARD HAVING AUXILIARY ANTENNA

CLAIM OF PRIORITY

This application claims priority under 35 U.S.C. §119(a) from a Korean Patent Application entitled "Antenna Apparatus for Printed circuit board Having Auxiliary Antenna" filed in the Korean Intellectual Property Office on Sep. 1, 2008 and assigned Serial No. 10-2008-0085917, the contents of which are incorporated herein by reference in its entirety.

BACKGROUND OF THE INVENTION

1. Field of the Invention

The present invention relates to an antenna apparatus for a printed circuit board having and ways to improve the efficiency and gain of such antenna apparatuses.

2. Description of the Related Art

In general, "a portable communication device" refers to a device which functions as wireless communication device, typically between the user and another person or an interactive server. Portable communication devices include HHP, CT-2 cellular phones, digital phones, PCSs, PDAs, etc. Wireless terminals can be classified into categories such as bar-type terminals, flip-type terminals, folder-type terminals, sliding-type terminals, and pop up-type terminals according to their appearance. Portable communication devices essentially include an antenna device, a data input/output device, and a data transmitting/receiving device. Further, the data input/output device generally uses an LCD or other type of thin display.

Furthermore, the number of users owning a portable communication device has dramatically increased to the point that most people now have their own personal portable communication device. Initially, portable communication devices were used to provide a voice service simply for telephone calls. However, terminals capable of providing enhanced functions, such as listening to the radio, reproducing MP3, watching a moving image, a remote control, or the like, have now exist and have become extremely popular.

The widely-used conventional monopole-type whip antenna or helical antenna has the structure of protruding from the exterior portion of the portable communication device. Newer portable communication devices tend to not have telescopically extendible antennas, which are giving way to built-in antennas that are embedded in the portable communication device. The built in antenna doesn't take or require as large a space as their protruding predecessors.

Examples of such built-in antennas include but in no way are limited to: the chip antenna, the Planar Inverted F Antenna (PIFA), the loop antenna, and the antenna apparatus for the printed circuit board (PCB).

In an example of a relatively low-cost model, the antenna apparatus for the printed circuit board in which an antenna pattern is formed on the printed circuit board is mainly used because of savings in material costs, as opposed to the carrier type antenna included in the built-in antenna.

An antenna apparatus of the printed circuits board typically utilizes a flat antenna, is easily implemented for the circuit and is low cost in comparison with the coil-type antenna, and thus overcomes many of the problems of conventional antenna apparatuses in the process.

As shown in FIG. 1, the conventional antenna apparatus 1 for the printed circuit board includes a Printed circuit board (PCB) 2 in which the components of the portable communication device are mounted, and an antenna pattern 3 functioning as radiator that is patterned on the PCB 2 in a predetermined shape.

The material of FR4 is widely used with the PCB 2 and the antenna pattern is printed with Copper (Cu).

However, in the conventional antenna apparatus for a printed circuit board, the antenna capacity typically decreases, so as to cause the degradation of the radiation performance, thereby deteriorating the efficiency and gain of the antenna.

Therefore, the conventional antenna apparatus for the printed circuit board has required the solution of the problems for saving material costs and improving the efficiency and gain of the antenna, and further requires to achieve a performance corresponding to or higher than a performance of conventional built-in antennas.

SUMMARY OF THE INVENTION

Accordingly, the present invention provides an antenna apparatus for a printed circuit board having an auxiliary antenna which may include a first and a second auxiliary antenna unit on both surfaces of the printed circuit board so as to improve the efficiency and gain of the antenna.

The present invention provides an antenna apparatus for a printed circuit board having an auxiliary antenna in which a first and a second auxiliary antenna units have a coupling unit on both surfaces of the printed circuit board so as to improve the efficiency and gain of the antenna, and thus to enhance the performance of the antenna.

In accordance with an exemplary aspect of the present invention, there is provided an antenna apparatus for a printed circuit board including an auxiliary antenna which includes printed circuit board mounting components and an antenna pattern formed on the printed circuit board, the antenna apparatus including: a first auxiliary antenna unit formed on an upper surface of the printed circuit board; and a second auxiliary antenna unit provided at a location on a lower surface of the printed circuit board that corresponds to where the first auxiliary antenna unit is formed on the upper surface of the printed circuit board.

The first auxiliary antenna unit and the second auxiliary antenna unit may include a slot antenna, and the slot antenna may preferably have a slot length of substantially 34 mm.

Moreover, the first auxiliary antenna unit and the second auxiliary antenna unit can implement a coupling effect in the range of substantially 1 to 100 nH (L) and 0.5 to 100 p(C) and exhibit the greatest efficiency at a value of about 68 nH (L) and 0.5 pF(C).

In accordance with another exemplary aspect of the present invention, there is provided an antenna apparatus for a printed circuit board including an auxiliary antenna having printed circuit board mounting components and an antenna pattern formed on the printed circuit board, the antenna apparatus including; a first auxiliary antenna unit formed on an upper surface of the printed circuit board and including a first coupling unit at one end of the first auxiliary antenna unit; and a second auxiliary antenna unit formed at a location corresponding to the location of the first auxiliary antenna unit on a lower surface of the printed circuit board and including a second coupling unit at a location corresponding to that of the first coupling unit.

The first auxiliary antenna unit and the second auxiliary antenna unit may further include a slot antenna. The first coupling unit and the second coupling unit can be formed in an "L" shape. The first coupling unit and the second coupling unit may also include a coupling surface.

In addition, according to an exemplary aspect of the present invention, the first auxiliary antenna unit and the second auxiliary antenna unit may implement a coupling effect in the range of substantially, for example, 1 to 100 nH(L) and 0.5 to 100 pF(C) and exhibit the greatest level of efficiency at the value of about 68 nH(L) and 0.5 pF(C).

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other exemplary aspects, features and advantages of the present invention will become more apparent from the following detailed description taken in conjunction with the accompanying drawings, in which.

DETAILED DESCRIPTION

Figure 1:
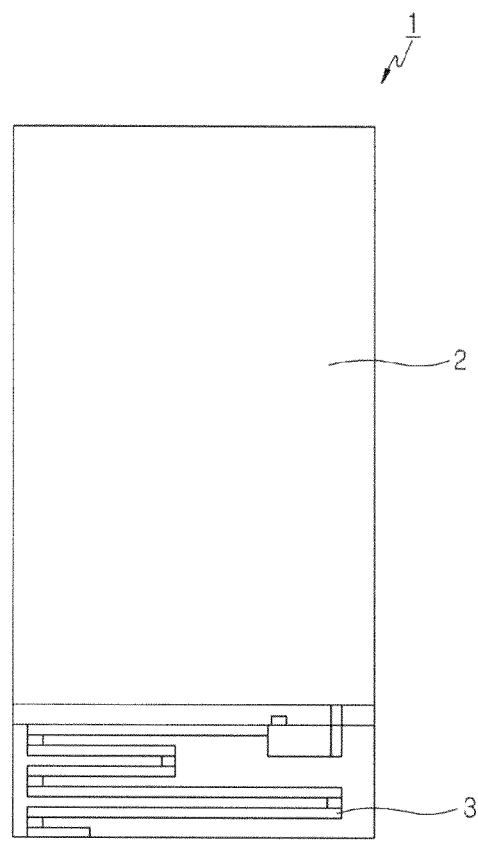
FIG. 1 is a plan view illustrating the construction of a conventional antenna apparatus for a printed circuit board.

Hereinafter, the first exemplary embodiments of the present invention will be described with reference to the accompanying drawings. The embodiments used herein and the constructions illustrated in the drawings are only examples presented for a better understanding of the invention by a person of ordinary skill in the art, and do not represent all the technical spirit of the present invention and the scope of the appended claims. It will be understood that there can be various alternative modifications at the time of filing the subject invention.

Figure 4:
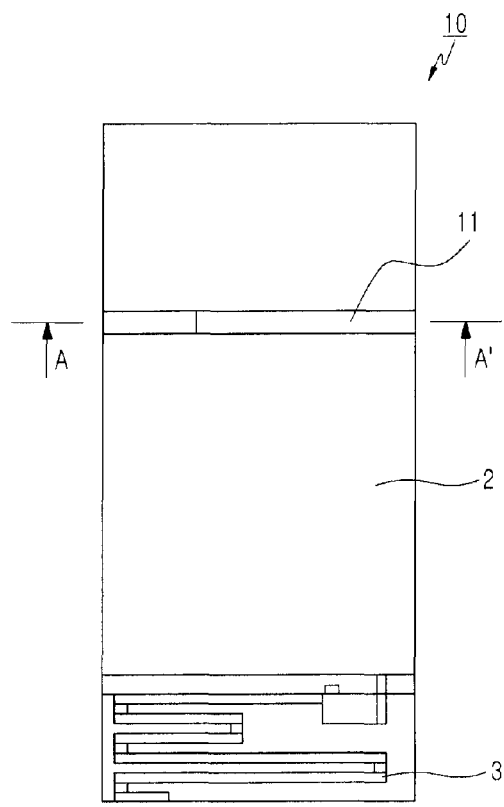
FIG. 4 is a plan view illustrating the construction of an antenna apparatus for a printed circuit board having an auxiliary antenna according to a first exemplary embodiment of the present invention.
Figure 5:
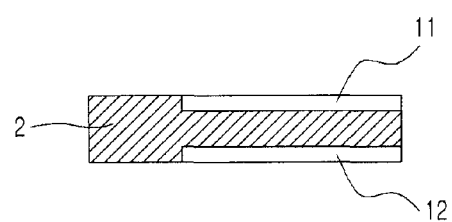
FIG. 5 is a view taken along the A-A' line of FIG. 4.

As shown in FIGS. 4 and 5, an antenna apparatus 10 for a printed circuit board 2 having an auxiliary antenna includes a first auxiliary antenna unit 11 and a second auxiliary antenna unit 12.

The first auxiliary antenna unit 11 is formed on an upper surface of the printed circuit board 2 to be mounted at a position of the upper surface corresponding to a position of a lower surface of the printed circuit board whereat second auxiliary antenna unit 12 is mounted (described infra).

The second auxiliary antenna unit 12 is formed on the lower surface of the printed circuit board 2 and mounted at a position corresponding to the position on the upper surface of the printed circuit board where the first auxiliary antenna unit 11 is mounted, in order to improve the overall efficiency and gain of the antenna.

The first auxiliary antenna unit 11 and the second auxiliary antenna unit 12 are formed with a slot antenna and the slot antenna preferably has a slot length of approximately 34 mm at an example operating frequency of 849 MHz of the antenna apparatus as seen in Table I discussed below, i.e., at substantially one tenth of a wavelength at the operating frequency.

The first auxiliary antenna unit 11 and the second auxiliary antenna unit 12 implement a coupling effect in the range of substantially 1 to 100 nH(L) and 0.5 to 100 pF(C) and exhibit a maximal efficiency at values of substantially 0.5 pF(C) and 68 nH(L).

The operating process of the antenna apparatus for the printed circuit board having the auxiliary antenna according to the first exemplary embodiment of the present invention having the aforementioned construction will be now described with reference to accompanying FIGS. 4 and 5 in more detail.

Referring again to FIGS. 4 and 5, the first auxiliary antenna unit 11 is formed on the upper surface of the printed circuit board 2 in which the components are mounted and the second auxiliary antenna unit 12 is formed at a position on the lower surface of the printed circuit board 2 corresponding to where the first auxiliary antenna unit 11 is mounted.

The first auxiliary antenna unit 11 and the second auxiliary antenna unit 12 typically include a slot antenna having an exemplary slot length of approximately 34 mm.

It should be noted that if the first auxiliary antenna unit 11 and the second auxiliary antenna unit 12 are not provided in the printed circuit board 2, the average efficiency of the antenna is 43.7%. If the first auxiliary antenna unit 11 and the second auxiliary antenna unit 12 having a slot length of approximately 12 mm are formed on the printed circuit board 2, the average efficiency of the antenna is 48.2%. If the first auxiliary antenna unit 11 and the second auxiliary antenna unit 12 having a slot length of approximately 34 mm are formed on the printed circuit board 2, the average efficiency of the antenna is 60.5%. If the first auxiliary antenna unit 11 and the second auxiliary antenna unit 12 having a slot length of 50 mm are formed on the printed circuit board 2, the average efficiency of the antenna is 56%.

Therefore, it can be deduced that if the slot length of the first auxiliary antenna unit 11 and the second auxiliary antenna unit 12 is 34 mm, the average efficiency improves as much as 17% over not providing the first and second auxiliary antennas.

Furthermore, the result of the test performed with the first auxiliary antenna unit 11 and the second auxiliary antenna unit 12 having an exemplary slot length of 34 mm is represented in the following table:

TABLE 1

| F (MHZ) | Ave Gain (dB) | Peak Gain | Direc Gain | Effi. (%) | Condition | F (MHZ) | Ave Gain (dB) | Peak Gain | Direc Gain | Effi. (%) | Condition |
|---|---|---|---|---|---|---|---|---|---|---|---|
| 849 | −1.4 | 2.12 | 3.48 | 73 | Slot type (L connection_1 nH) | | | | | | |
| 849 | −1.9 | 1.71 | 3.67 | 77 | Slot type (L connection_5.6 nH) | 849 | −0.6 | 2.63 | 3.2 | 88 | Slot type (C connection_0.5p) |
| 849 | −1.2 | 2.33 | 3.48 | 71 | Slot type (L connection_10 nH) | 849 | −0.9 | 2.86 | 3.75 | 82 | Slot type (C connection_1p) |
| 849 | −1.5 | 1.42 | 2.91 | 78 | Slot type (L connection_22 nH) | 849 | −1.4 | 3.18 | 4.54 | 73 | Slot type (C connection_8p) |
| 849 | −1.1 | 2.56 | 3.64 | 82 | Slot type (L connection_33 nH) | 849 | −0.8 | 2.82 | 3.65 | 83 | Slot type (C connection_12p) |
| 849 | −0.9 | 2.4 | 3.28 | 78 | Slot type (L connection_47 nH) | 849 | −1.0 | 2.9 | 3.93 | 79 | Slot type (C connection_22p) |
| 849 | −1.1 | 1.52 | 2.58 | 83 | Slot type (L connection_68 nH) | 849 | −0.9 | 2.86 | 3.83 | 80 | Slot type (C connection_33p) |
| 849 | −0.8 | 2.68 | 3.5 | 64 | Slot type (L connection_100 nH) | 849 | −1.3 | 2.98 | 4.28 | 74 | Slot type (C connection_47p) |
| | | | | | | 849 | −0.9 | 2.93 | 3.89 | 80 | Slot type (C connection_56p) |
| | | | | | | 849 | −0.9 | 2.94 | 3.92 | 80 | Slot type (C connection_100p) |

As shown in Table 1, it can be seen that the first auxiliary antenna unit 11 and the second auxiliary antenna unit 12 show the greatest efficiency at a value of 68 nH (L) and 0.5 p(C).

As shown in Table 1, it can be seen that the first auxiliary antenna unit 11 and the second auxiliary antenna unit 12 show the greatest efficiency at a value of 68 nH (L) and 0.5 pF(C).

As such, when the first auxiliary antenna unit 11 and the second auxiliary antenna unit 12 are implemented with the slot, rather than a coupling surface, a coupling effect is achieved in the range of 1 to 1000 nH(L) and 0.5 to 100 pF(C).

Figure 2:
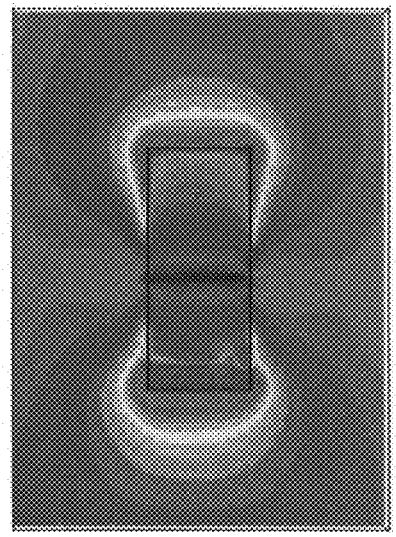
FIG. 2 is a view illustrating a pattern of an Electric field (E-field) of a conventional antenna apparatus for a printed circuit board.
Figure 3:
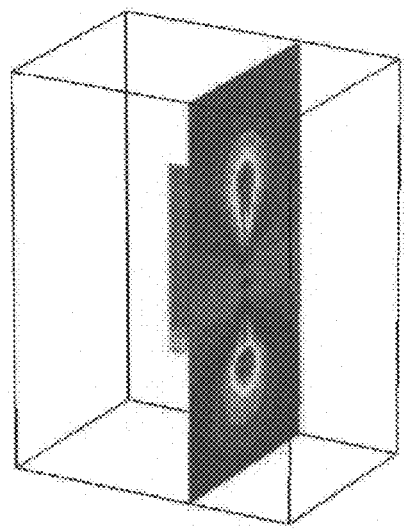
FIG. 3 is a perspective view illustrating a pattern of an Electric field (E-field) of a conventional antenna apparatus for a printed circuit board.
Figure 8:
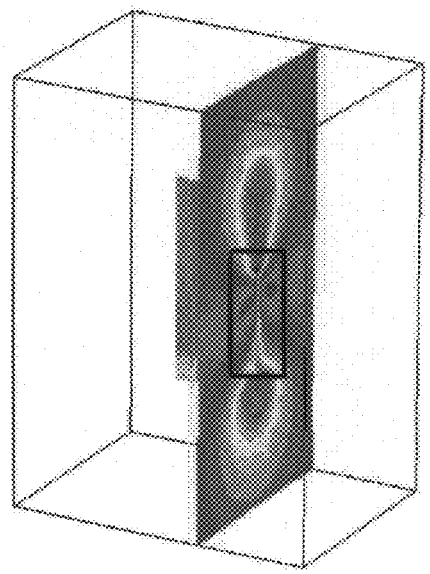
FIG. 8 is a perspective view illustrating a pattern of an E-field of an antenna apparatus for a printed circuit board having an auxiliary antenna according to the first and second exemplary embodiments of the present invention.
Figure 9:
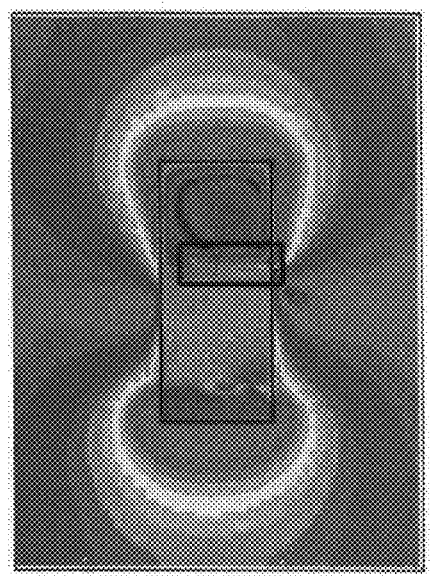
FIG. 9 is a perspective view illustrating a pattern of an E-field of an antenna apparatus for a printed circuit board having an auxiliary antenna according to the first and second exemplary embodiments of the present invention.

Prior art FIGS. 2 and 3 illustrate the variation of the E-field in the conventional printed circuit board 2, and FIGS. 8 and 9 illustrate the variation of the E-field of the first auxiliary antenna unit 11 and the second auxiliary antenna unit 12 according to the present invention.

More particularly, FIGS. 8 and 9 illustrate the E-field newly generated in the printed circuit board 2 when the first auxiliary antenna unit 11 and the second auxiliary antenna unit 12 are formed on the printed circuit board 2 as in the present invention.

In this respect, it can be identified that the efficiency and gain of the antenna is improved over the conventional construction.

Now referring to FIGS. 6 and 7, the operating process of an antenna apparatus for the printed circuit board having the auxiliary antenna according to a second exemplary embodiment of the present invention having the foregoing construction will be described in more detail.

Figure 6:
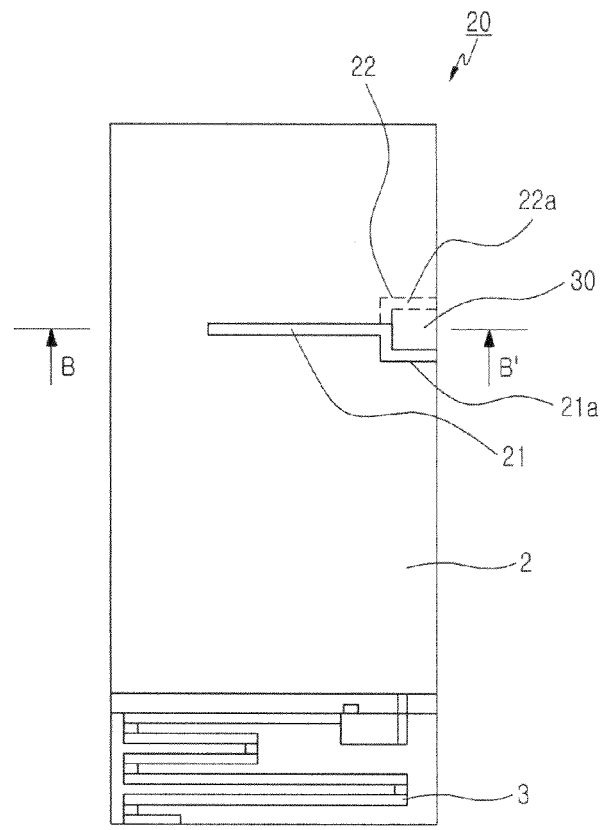
FIG. 6 is a plan view illustrating the construction of an antenna apparatus for a printed circuit board having an auxiliary antenna according to a second exemplary embodiment of the present invention.
Figure 7:
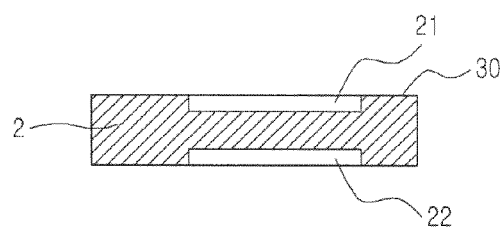
FIG. 7 is a view taken along the B-B' line of FIG. 4.

As shown in FIGS. 6 and 7, in the antenna apparatus 20 for the printed circuit board, a first auxiliary antenna unit 21 is formed on an upper surface of the printed circuit board 2 in which the components are mounted and a first coupling unit 21a is formed on one end of the first auxiliary antenna unit 21. A second auxiliary antenna unit 22 is provided at a place corresponding to that of the first auxiliary antenna unit 21 on a lower surface of the printed circuit board 2, and a second coupling unit 22a is formed at a location on the lower surface of the printed circuit board corresponding to the upper surface location where the first coupling unit 21a is arranged, along one end of the second auxiliary antenna unit 22.

The first auxiliary antenna unit 21 and the second auxiliary antenna unit 22 include the slot antenna and the slot antenna preferably has a slot length of substantially 34 mm.

The first auxiliary antenna unit 21 and the second auxiliary antenna unit 22 are formed to have an "L" shape, and the first coupling unit 21a and the second coupling unit 22a are formed on a coupling surface 30.

Further, the result of the test performed with the first auxiliary antenna unit 21 and the second auxiliary antenna unit 22 having a slot length of 34 mm is represented in the following table.

TABLE 2

| F (MHZ) | Ave Gain (dB) | Peak Gain | Direc Gain | Effi. (%) | Condition | F (MHZ) | Ave Gain (dB) | Peak Gain | Direc Gain | Effi. (%) | Condition |
|---|---|---|---|---|---|---|---|---|---|---|---|
| 849 | −1.4 | 2.12 | 3.48 | 73 | Slot type (L connection_1 nH) | | | | | | |
| 849 | −1.9 | 1.71 | 3.67 | 77 | Slot type (L connection_5.6 nH) | 849 | −0.6 | 2.63 | 3.2 | 88 | Slot type (C connection_0.5p) |
| 849 | −1.2 | 2.33 | 3.48 | 71 | Slot type (L connection_10 nH) | 849 | −0.9 | 2.86 | 3.75 | 82 | Slot type (C connection_1p) |
| 849 | −1.5 | 1.42 | 2.91 | 78 | Slot type (L connection_22 nH) | 849 | −1.4 | 3.18 | 4.54 | 73 | Slot type (C connection_8p) |
| 849 | −1.1 | 2.56 | 3.64 | 82 | Slot type (L connection_33 nH) | 849 | −0.8 | 2.82 | 3.65 | 83 | Slot type (C connection_12p) |
| 849 | −0.9 | 2.4 | 3.28 | 78 | Slot type (L connection_47 nH) | 849 | −1.0 | 2.9 | 3.93 | 79 | Slot type (C connection_22p) |
| 849 | −1.1 | 1.52 | 2.58 | 83 | Slot type (L connection_68 nH) | 849 | −0.9 | 2.86 | 3.83 | 80 | Slot type (C connection_33p) |
| 849 | −0.8 | 2.68 | 3.5 | 64 | Slot type (L connection_100 nH) | 849 | −1.3 | 2.98 | 4.28 | 74 | Slot type (C connection_47p) |
| | | | | | | 849 | −0.9 | 2.93 | 3.89 | 80 | Slot type (C connection_56p) |
| | | | | | | 849 | −0.9 | 2.94 | 3.92 | 80 | Slot type (C connection_100p) |

As shown in Table 2, it can be identified that the first auxiliary antenna unit 21 and the second auxiliary antenna unit 22 show the most excellent efficiency at a value of 68 nH(L) and 0.5 pF(C).

As such, the first auxiliary antenna unit 21 and the second auxiliary antenna unit 22 achieves a coupling effect in the range of 1 to 100 nH(L) and 0.5 to 100 pF(C).

FIGS. 2, 3, 8, and 9 illustrate the variation of the E-field of the first auxiliary antenna unit 21 and the second auxiliary antenna unit 22, in which FIGS. 2 and 3 illustrate the variation of the E-field in the conventional printed circuit board 2, and FIGS. 8 and 9 illustrates the E-field newly generated in the printed circuit board 2 when the first auxiliary antenna unit 21 and the second auxiliary antenna unit 22 are formed on the printed circuit board 2.

In this respect, it can be identified that the efficiency and gain of the antenna is improved.

While the antenna apparatus for the printed circuit board having the auxiliary antenna of the present invention has been shown and described with reference to certain exemplary embodiments and drawings thereof, it will be understood by those skilled in the art that various changes in form and details may be made therein without departing from the spirit and scope of the invention as defined by the appended claims. For example, the 34 mm slot length is a preferred value, and slot lengths longer or shorter will provide a reduced efficiency.

What is claimed is:

1. An antenna apparatus comprising:
    a first auxiliary antenna unit formed on an upper surface of a printed circuit board including printed circuit board mounting components; and
    a second auxiliary antenna unit formed on a lower surface of the printed circuit board that corresponds to a location where the first auxiliary antenna unit was formed on the upper surface of the printed circuit board;
    wherein the first and second auxiliary antenna units each includes a slot antenna.

2. The antenna apparatus as claimed in claim 1, wherein each slot antenna has a slot length of substantially one tenth of a wavelength at an operating frequency of the antenna apparatus.

3. The antenna apparatus as claimed in claim 1, wherein arrangement of the first auxiliary antenna unit and the second auxiliary antenna unit on the printed circuit board provide a coupling effect in the range of 1 to 100 nH(L) and 0.5 to 100 pF(C).

4. The antenna apparatus as claimed in claim 3, wherein the antenna apparatus exhibits a greatest value of efficiency at a value of substantially 68 nH (L) and 0.5 pF(C).

5. An antenna apparatus comprising:
    a first auxiliary antenna unit formed on an upper surface of a printed circuit board including printed circuit board mounting components, the first auxiliary antenna unit comprising a first coupling unit along an end of the first auxiliary antenna unit; and
    a second auxiliary antenna unit formed on a lower surface of the printed circuit board that corresponds to a location where the first auxiliary antenna unit was formed on an upper surface of the printed circuit board; and further comprising a second coupling unit at a location on the printed circuit board corresponding to a location of where the first coupling unit is arranged;
    wherein the first and second auxiliary antenna units each includes a slot antenna.

6. The antenna apparatus as claimed in claim 5, wherein the first coupling unit and the second coupling unit are formed in an "L" shape.

7. The antenna apparatus as claimed in claim 5, wherein the first coupling unit and the second coupling unit comprise a coupling surface.

8. The antenna apparatus as claimed in claim 5, wherein the first auxiliary antenna unit and the second auxiliary antenna unit implement a coupling effect in the range of 1 to 100 nH(L) and 0.5 to 100 pF(C) and show the most excellent efficiency at the value of 68 nH(L) and 0.5 pF(C).

9. A method for providing an antenna apparatus, the method comprising the steps of:
    forming a first auxiliary antenna unit comprising a first slot antenna at an upper surface of a printed circuit board including printed circuit board mounting components; and
    forming a second auxiliary antenna unit comprising a second slot antenna at a lower surface of the printed circuit board that corresponds to a location of the first auxiliary antenna unit on the upper surface of the printed circuit board, thereby forming the antenna apparatus including the first and second auxiliary antenna units.

10. The method according to claim 9, further comprising:
    arranging a first coupling unit along an end of the first auxiliary antenna unit on the upper surface of the printed circuit board; and
    arranging a second coupling unit on the lower surface of the printed circuit board at a location corresponding to a location of where the first coupling unit is arranged.

11. The method according to claim 10, wherein the first coupling unit and the second coupling unit are formed in an "L" shape.

12. An antenna apparatus manufactured according to the process recited in claim 10.

13. The method according to claim 9, wherein the first and second auxiliary antenna unit and the second auxiliary antenna unit include a slot antenna having a slot length of substantially one tenth of a wavelength at an operating frequency of the antenna apparatus.

14. An antenna apparatus manufactured according to the process recited in claim 9.

15. An antenna apparatus for a printed circuit board having an auxiliary antenna which includes printed circuit board mounting components and an antenna pattern formed on the printed circuit board, the antenna apparatus comprising:
    a first auxiliary antenna unit formed on an upper surface of the printed circuit board; and
    a second auxiliary antenna unit formed on a lower surface of the printed circuit board that corresponds to a location where the first auxiliary antenna unit was formed on the upper surface of the printed circuit board;
    wherein the first auxiliary antenna unit and the second auxiliary antenna unit include a slot antenna, and the slot antenna has a slot length of substantially one tenth of a wavelength at an operating frequency of the antenna apparatus.

16. An antenna apparatus for a printed circuit board comprising an auxiliary antenna having printed circuit board mounting components and an antenna pattern formed on the printed circuit board, the antenna apparatus comprising;
    a first auxiliary antenna unit formed on an upper surface of the printed circuit board and comprising a first coupling unit along an end of the first auxiliary antenna unit; and
    a second auxiliary antenna unit formed on a lower surface of the printed circuit board that corresponds to a location where the first auxiliary antenna unit was formed on an upper surface of the printed circuit board; and further comprising a second coupling unit at location on the printed circuit board corresponding to a location of where the first coupling unit is arranged;
    wherein the first auxiliary antenna unit and the second auxiliary antenna unit include a slot antenna.

17. An antenna apparatus for a printed circuit board comprising an auxiliary antenna having printed circuit board mounting components and an antenna pattern formed on the printed circuit board, the antenna apparatus comprising;
    a first auxiliary antenna unit formed on an upper surface of the printed circuit board and comprising a first coupling unit along an end of the first auxiliary antenna unit; and
    a second auxiliary antenna unit formed on a lower surface of the printed circuit board that corresponds to a location where the first auxiliary antenna unit was formed on an upper surface of the printed circuit board; and further comprising a second coupling unit at location on the printed circuit board corresponding to a location of where the first coupling unit is arranged;

wherein the first coupling unit and the second coupling unit are formed in an "L" shape.

18. A method for providing an antenna apparatus including printed circuit board mounting components and an antenna pattern formed on a printed circuit board, comprising the steps of:

forming a first auxiliary antenna unit on an upper surface of the printed circuit board; and forming a second auxiliary antenna unit on a lower surface of the printed circuit board that corresponds to a location where the first auxiliary antenna unit was formed on the upper surface of the printed circuit board;

wherein the first auxiliary antenna unit and the second auxiliary antenna unit include a slot antenna having a slot length of substantially one tenth of a wavelength at an operating frequency of the antenna apparatus.

19. The method according to claim 18, wherein the first coupling unit and the second coupling unit are formed in an "L" shape.

* * * * *